United States Patent
Boirin et al.

(10) Patent No.: US 6,853,216 B2
(45) Date of Patent: Feb. 8, 2005

(54) DEVICE FOR RECEIVING DIGITAL SIGNALS

(75) Inventors: Stéphane Boirin, Chaville (FR); Jean-Yves Couleaud, Vendome (FR)

(73) Assignee: Thales, Paris (FR)

( * ) Notice: Subject to any disclaimer, the term of this patent is extended or adjusted under 35 U.S.C. 154(b) by 0 days.

(21) Appl. No.: 10/416,009

(22) PCT Filed: Nov. 7, 2001

(86) PCT No.: PCT/FR01/03447

§ 371 (c)(1),
(2), (4) Date: Sep. 30, 2003

(87) PCT Pub. No.: WO02/39589

PCT Pub. Date: May 16, 2002

(65) Prior Publication Data

US 2004/0056680 A1 Mar. 25, 2004

(30) Foreign Application Priority Data

Nov. 7, 2000 (FR) .......................................... 00 14260

(51) Int. Cl.$^7$ ........................................ H03K 19/0175
(52) U.S. Cl. ............................. 326/63; 326/60; 341/51
(58) Field of Search ........................ 326/62–63, 59–60; 330/50–51

(56) References Cited

U.S. PATENT DOCUMENTS 4,280,221 A    7/1981   Larsen et al.
4,860,009 A    8/1989   LaRowe
5,198,700 A    3/1993   Whiteside
5,719,577 A  * 2/1998   Pitot et al. ................... 341/157
6,140,841 A  * 10/2000  Suh .............................. 326/60

FOREIGN PATENT DOCUMENTS

EP    0 451 897 A    10/1991
EP    0 807 888 A    11/1997

* cited by examiner

Primary Examiner—James H. Cho
(74) Attorney, Agent, or Firm—Lowe Hauptman Gilman & Berner LLP.

(57) ABSTRACT

The invention relates to a device for receiving digital signals on the basis of two different standards conveyed on the same medium. A logic-level conversion device receives the digital signals and converts their logic levels into logic levels on the basis of a single standard. Reception is provided for receiving signals coded on the basis of a first standard, which signals are output by the logic-level conversion device. Signals coded on the basis of a second standard are converted into signals coded on the basis of the first standard, which signals are output by the logic-level conversion device. Signals are transferred which are output as converted signals coded on the basis of a second standard into signals coded on the basis of the first standard to the reception device upon reception of signals coded on the basis of the second standard, or for transferring signals output by the logic-level conversion device upon reception of signals coded on the basis of the first standard.

20 Claims, 4 Drawing Sheets

| LEVEL | ARINC | LEVEL | TTL |
| --- | --- | --- | --- |
| 429 | 568 | 24 | 25 |
| HI | 1 | 1 | 0 |
| NULL | 0 | 0 | 0 |
| LO |  | 0 | 1 |

FIG.3a

| 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 |
|---|---|---|---|---|---|---|---|---|---|---|---|---|---|---|---|---|---|---|---|---|---|---|---|---|---|---|---|---|---|---|---|

| 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | P |
|---|---|---|---|---|---|---|---|---|---|---|---|---|---|---|---|---|---|---|---|---|---|---|---|---|---|---|---|---|---|---|---|---|
|   |   |   |   |   |   |   |   | 0 | 0 |   |   |   |   |   |   |   |   |   |   |   |   |   |   |   | 0 | 0 |   |   |   | 1 | 1 |   |

| 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | P |
|---|---|---|---|---|---|---|---|---|---|---|---|---|---|---|---|---|---|---|---|---|---|---|---|---|---|---|---|---|---|---|---|---|
|   |   |   |   |   |   |   |   | 1 | 0 |   |   |   |   |   |   |   | 0 | 0 | 0 | 0 | 0 | 0 | 0 | 0 | 0 | 0 |   |   |   | 1 | 1 |   |

30 ⎯ 33

DEVICE FOR RECEIVING DIGITAL SIGNALS

Cross Reference to Related Applications

This application is a U.S. National Stage application of International Application No. PCT/FR001/03447, and claims priority to French Patent Application No. 00/14260, filed Nov. 7, 2000.

FIELD OF INVENTIONS

The invention relates to a device for receiving digital signals used essentially in the transfer of data between various pieces of equipment fitted on board an aircraft. The "Airlines Electronic Engineering Committee" in the United States has defined a plurality of standards for transmitting digital data, which are known by the name of ARINC (Aeronautical Radio Incorporation) standards.

1. Background of the Invention

Today, a plurality of these standards are used on one aircraft and require as many different physical media as there are standards used. The aim of the invention is to reduce the number of physical media by allowing the reception of data conveyed on a single medium on the basis of two different standards, for example the ARINC 429 and ARINC 568 standards. Details of these standards can be obtained from Aeronautical Radio Incorporation (ARINC), 2251 River Road, ANNAPOLIS, Md. 21401, USA.

2. Summary of the Invention

Still other objects and advantages of the present invention will become readily apparent to those skilled in the art from the following detailed description, wherein the preferred embodiments of the invention are shown and described, simply by way of illusion of the best mode contemplated of carrying out the invention. As will be realized, the invention is capable of other and different embodiments, and its several details are capable of modifications in various obvious respects, all without departing from the invention. Accordingly, the drawings and description thereof are to be regarded as illustrative in nature, and not as restrictive.

To achieve this aim, the subject of the invention is a device for receiving digital signals on the basis of two different standards conveyed on the same medium, characterized in that it comprises:

logic-level conversion means receiving the digital signals and converting their logic levels into logic levels on the basis of a single standard, means for receiving signals coded on the basis of a first standard, which signals are output by the logic-level conversion means, means for converting signals coded on the basis of a second standard into signals coded on the basis of the first standard, which signals are output by the logic-level conversion means, means for transferring signals output by the means for converting signals coded on the basis of a second standard into signals coded on the basis of the first standard to the reception means upon reception of signals coded on the basis of the second standard, or for transferring signals output by the logic-level conversion means upon reception of signals coded on the basis of the first standard.

The invention will be better understood and other advantages will emerge upon reading the detailed description of an embodiment, said description being illustrated by the appended drawing, in which:

BRIEF DESCRIPTION OF THE DRAWINGS

The present invention is illustrated by way of example, and not by limitation, in the figures of the accompanying drawings, wherein elements having the same reference numeral designations represent like elements throughout and wherein:

FIGS. 3a, 3b and 3c show an example of converting signals coded on the basis of the ARINC 568 standard into signals coded on the basis of the ARINC 429 standard.

DETAILED DESCRIPTION

It will be readily seen by one of ordinary skill in the art that the present invention fulfills all of the objects set forth above. After reading the foregoing specification, one of ordinary skill will be able to affect various changes, substitutions of equivalents and various other aspects of the invention as broadly disclosed herein. It is therefore intended that the protection granted hereon be limited only by the definition contained in the appended claims and equivalents thereof.

The embodiment described below refers to the ARINC 429 and 568 standards for coding digital signals. It goes without saying that the invention can be implemented for other standards or for standards similar to the two standards cited insofar as it is possible to convert a signal coded on the basis of a first standard into another signal coded on the basis of the second standard. It is equally possible to implement the invention in a device for receiving digital signals which is capable of receiving signals on the basis of more than two standards.

The ARINC 429 standard uses two electrical conductors in the form of twisted wires, called a twisted pair, advantageously surrounded by a screen forming a shield allowing protection against any electromagnetic interference. This pair carries the signals coded on the basis of the ARINC 429 standard serially. The differential voltage between the conductors in the pair defines three logic levels. These data are organized in the form of 32-bit words, the structure of which will be described at a later point.

For its part, the ARINC 568 standard uses six electrical conductors in the form of three, advantageously shielded, twisted pairs. The differential voltage between the two conductors in each of the pairs defines two logic levels. On the first pair, the differential voltage forms a clock signal oscillating at a given frequency, for example at 11 kbits/s, between the two logic levels. The differential voltage between the two conductors in the second pair forms a data signal in the form of 32-bit words. The differential voltage between the two conductors in the third pair forms a synchronization signal.

Figure 1:
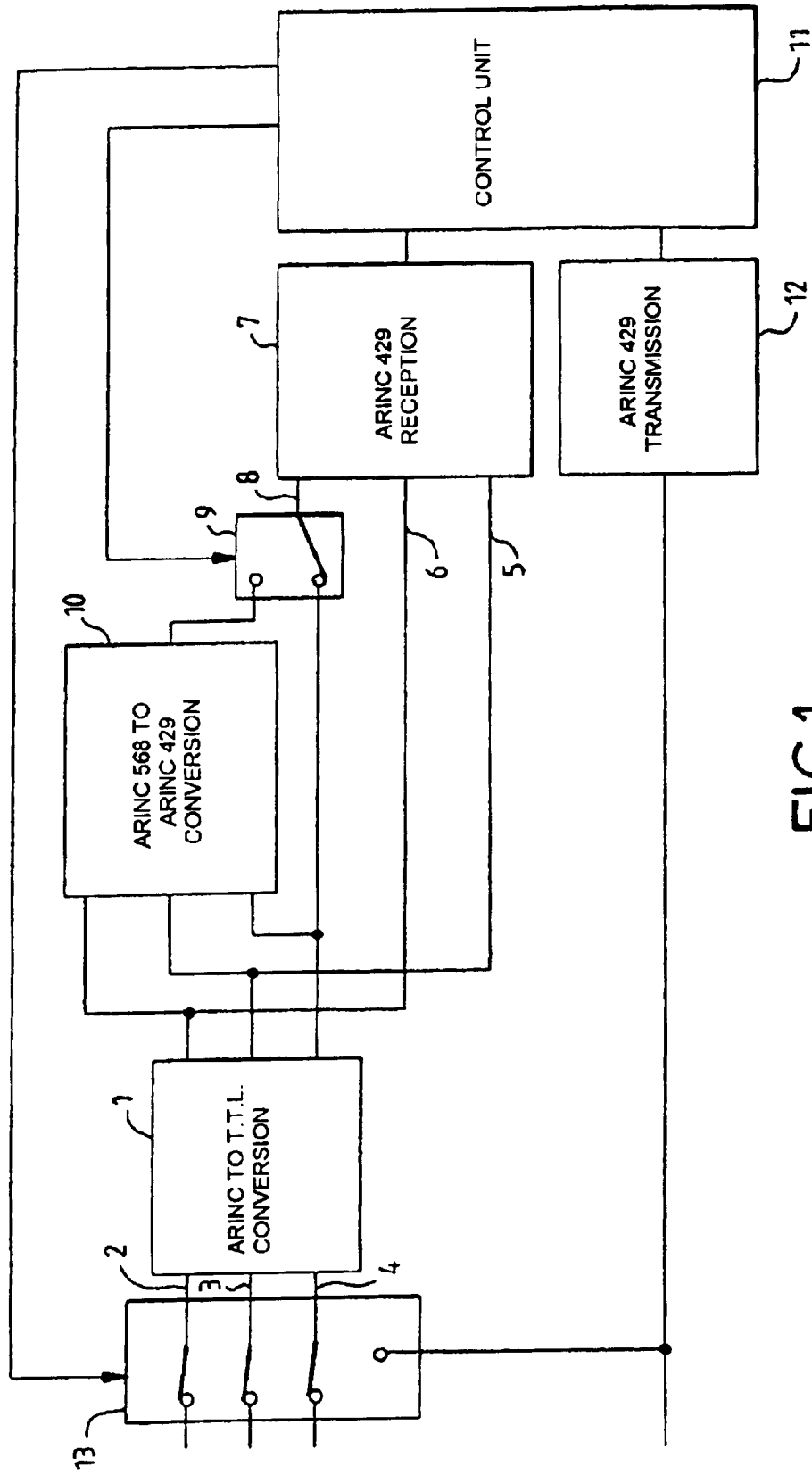
FIG. 1 shows a block diagram of an example of a device for receiving digital signals in line with the invention.

To simplify the illustration in FIG. 1, each pair is represented by a linking line. Logic-level conversion means 1 receive three pairs at inputs 2, 3 and 4. These three inputs can receive either three separate series of signals coded on the basis of the ARINC 429 standard in parallel or one series of signals coded on the basis of the ARINC 568 standard. At the output, the means 1 transmit the three signals received on the basis of one or other of the two standards ARINC 429 or 568, modified such that they comprise only two logic levels, for example in line with the T.T.L. standard. This standard takes its name (Transistor, Transistor, Logic) from a technology which uses bipolar transistors at the input and output. In line with this standard, logic level 0 corresponds to a voltage lower than 0.8 volt and logic level 1 corresponds to a voltage higher than 2.4 volts. A detailed description of the means 1 will be given at a later point with reference to FIGS. 2a, 2b and 2c.

The first two of the three signals transmitted by the means 1 are received directly at two inputs 5 and 6 on means 7 for receiving signals coded on the basis of the ARINC 429 standard. The third signal transmitted by the means 1 is received at an input 8 on the reception means 7 via signal-transfer means 9.

The three signals transmitted by the means 1 are also received by means 10 for converting signals coded on the basis of the ARINC 568 standard into signals coded on the basis of the ARINC 429 standard. The conversion means 10 transmit to the means 9 a signal coded on the basis of the ARINC 429 standard, which is output from the conversion of three signals coded on the basis of the ARINC 568 standard, which signals are received via the conversion means 10.

The transfer means 9 receive either the signal which is output by the conversion means 10 or the third signal which is output by the logic-level conversion means 1. The two signals able to be received by the transfer means 9 have been coded on the basis of the ARINC 429 standard. Advantageously, the choice regarding the transfer means 9 receiving one of the two signals described above is made by a control unit 11 which governs the transfer means 9.

Advantageously, the device also comprises means for testing its operation. By way of example, the test means comprise means 12 for transmitting data on the basis of the ARINC 429 standard, which transmission means 12 are governed by the control unit 11. The test means also comprise analog multiplexing means 13 governed by the control unit 11. The means 13 are situated upstream of the three inputs 2, 3 and 4 on the logic-level conversion means 1.

When the device's operating test is not active, the multiplexing means 13 transmit to the inputs 2, 3 and 4 the data coded on the basis of one of the standards ARINC 429 or 568, which the device receives, and the transmission means 12 can be used to transmit data coded on the basis of the ARINC 429 standard to another piece of electronic equipment in the aircraft. By contrast, when the device's operating test is active, the multiplexing means no longer transmit the data received by the device but rather transmit a signal which is output by the transmission means 12. This signal is transmitted to the three inputs 2, 3 and 4. Furthermore, the reception means 7 are connected to the control unit 11. Thus, by transmitting a signal through the transmission means 12, the control unit 11 can test correct operation of the transmission means 12 associated with the conversion means 1, as it can for the reception means 7 by comparing the signal which is output by the transmission means 12 with the signal received by the reception means 7.

Figures 2A, 2B:
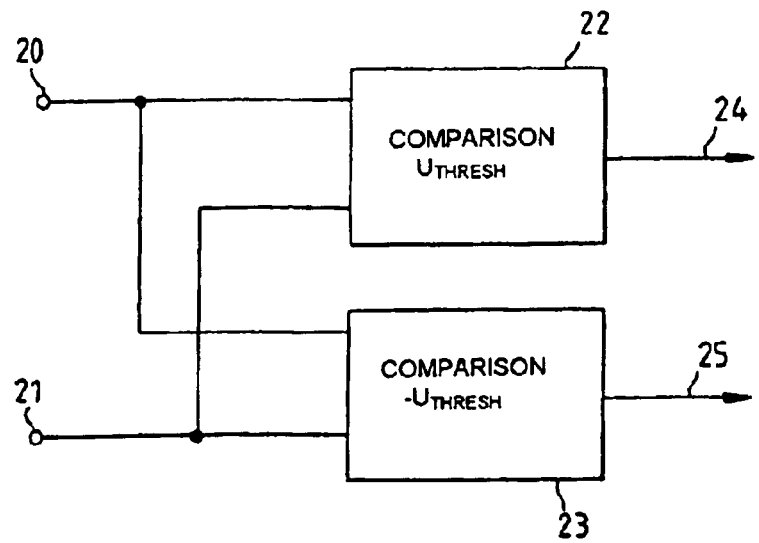
FIGS. 2a, 2b and 2c show an exemplary embodiment of the logic-level conversion means.
Figure 2C:
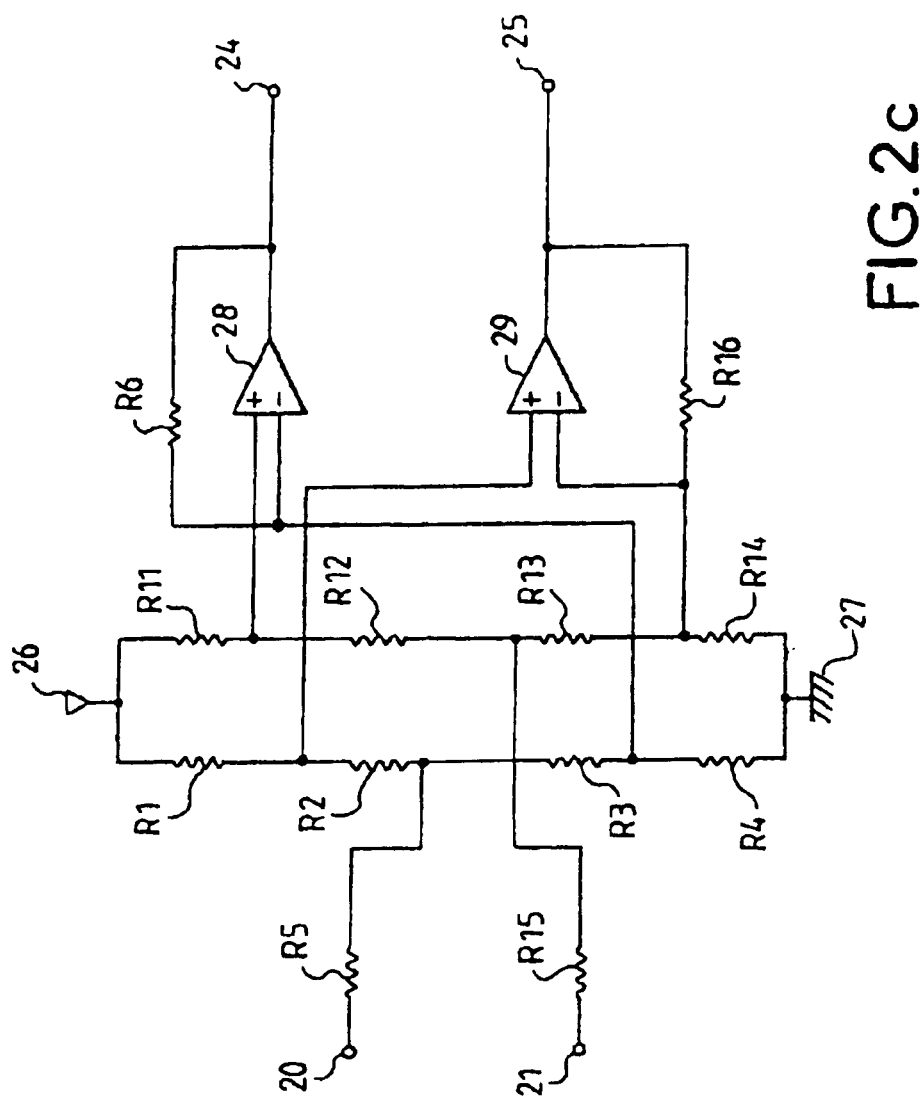

FIGS. 2a, 2b and 2c can be used to describe an exemplary embodiment of the logic-level conversion means 1. The ARINC 429 standard makes provision for a signal coded on the basis of this standard to be able to take three logic levels. A first, high level denoted "HI" is defined when the differential voltage between the two conductors in the pair is higher than 6.5 volts. A second, null level denoted "NULL" is defined when this voltage is between –2.5 volts and +2.5 volts. A third, low level denoted "LO" is defined when this voltage is lower than –6.5 volts. On the other hand, the ARINC 568 standard defines only two logic levels. A first, high level denoted "1" is defined when the differential voltage is higher than or equal to 7 volts, and a second low level denoted "0" is defined when the differential voltage is between –3 volts and +3 volts.

FIG. 2a schematically shows the operation of the logic-level conversion means 1 for one of the inputs 2, 3 or 4 on the means 1. The input under consideration receives the two conductors in a pair, each at a point 20 or 21. Between these two points there can be the various logic levels from the two standards ARINC 429 and 568. The differential voltage between points 20 and 21 is simultaneously compared with a first voltage $U_{thresh}$ and with a second voltage $-U_{thresh}$, the value of which is advantageously more or less equal to the opposite of the value of the first voltage $U_{thresh}$. These two comparisons are schematically represented by the rectangle 22 for the comparison with the voltage $U_{thresh}$ and by the rectangle 23 for the comparison with the voltage $-U_{thresh}$. The outputs 24 and 25 of the rectangles 22 and 23 respectively represent the results of the comparisons with $U_{thresh}$ and $-U_{thresh}$. These outputs take one of the logic levels from the T.T.L. standard. For rectangle 22, if the differential voltage between points 20 and 21 is higher than $U_{thresh}$, the output 24 takes logic level 1, and in the opposite case the output 24 takes logic level 0. Likewise, for rectangle 23, if the differential voltage between points 20 and 21 is higher than $-U_{thresh}$, the output 25 takes a logic level of 0, and in the opposite case the output 25 takes a logic level of 1.

By choosing a value for the voltage $U_{thresh}$ of between 3 and 6.5 volts, the logic-level conversion means 1 can unequivocally convert the logic levels of signals coded on the basis of one of the standards ARINC 429 or 568 into a logic level based on the T.T.L. standard. This conversion is described artificially in the table shown in FIG. 2b, which contains two double columns. The left-hand part of the first double column contains the three logic levels, one per row, from the ARINC 429 standard, and its right-hand part contains the two logic levels, in the first two rows of the table, from the ARINC 568 standard. The second double column contains the logic levels at the output 24 in the left-hand part and at the output 25 in the right-hand part. For the logic level HI, in line with the ARINC 429 standard, or 1, in line with the ARINC 568 standard, which is at the inputs 20 and 21, there is a corresponding logic level of 1 at the output 24 and a corresponding logic level of 0 at the output 25 in line with the T.T.L. standard. For the logic level NULL, in line with the ARINC 429 standard, or 0, in line with the ARINC 568 standard, which is at the inputs 20 and 21, there is a corresponding logic level of 0 at the output 24 and a corresponding logic level of 0 at the output 25 in line with the T.T.L. standard. For the logic level LO, in line with the ARINC 429 standard, which is at the inputs 20 and 21, there is a corresponding logic level of 0 at the output 24 and a corresponding logic level of 1 at the output 25 in line with the T.T.L. standard.

FIG. 2c shows an exemplary embodiment of the logic-level conversion means 1, described schematically on the basis of FIG. 2a. Connected in series and in order between a DC supply voltage 26 and a ground point 27, there are, firstly, four resistors R1, R2, R3, R4 and, secondly, four other resistors R11, R12, R13 and R14. The point 20 is connected to the common point between the resistors R2 and R3 via a resistor R5 and the point 21 is connected to the common point between the resistors R12 and R13 via a resistor R15. The noninverting input of an operational amplifier 28 is connected to the common point between the resistors R11 and R12, and the inverting input of the same amplifier 28 is connected to the common point between the resistors R3 and R4. Likewise, the noninverting input of a second operational amplifier 29 is connected to the common point between the resistors R1 and R2, and the inverting input of this same amplifier 29 is connected to the common point between the resistors R13 and R14. The output of the operational amplifier 28 forms the output 24 and is connected to its inverting input via a resistor R6. Likewise, the output of the operational amplifier 29 forms the output 25 and is connected to its inverting input via a resistor R16. It is advantageous to choose identical values for the resistors R1 and R11, likewise for the resistors R2 and R12, R3 and R13, R4 and R14, R5 and R15 and for R6 and R16. In this way, the value of the threshold voltage $U_{thresh}$ is more or less equal to the value of the opposite of the threshold voltage $-U_{thresh}$. The value of the threshold voltage $U_{thresh}$ is thus given by the following formula:

$$U_{thresh} = \frac{2 \times VCC \times R5 \times \left[1 + \frac{R2}{R5} + \frac{R2-R4}{R3+R4}\right]}{(R1 \times R2) \times \left[\frac{R1}{R1+R2} + \frac{R4}{R3+R4}\right]}$$

In this formula, VCC represents the difference in potential between the DC supply voltage 26 and the ground point 27. In this formula, it has also been assumed that the value of the resistor R6 is large as compared with the values of the other resistors, so that the hysteresis resulting from the resistor R6 is negligible.

An exemplary embodiment of the means for converting a signal coded on the basis of the ARINC 568 standard into a signal coded on the basis of the ARINC 429 standard is illustrated using FIGS. 3a, 3b and 3c. FIG. 3a shows a 32-bit word coded on the basis of the ARINC 568 standard on the second pair. The first byte of this word forms the label 30 for this word, and the three subsequent bytes, respectively bearing the references 31, 32 and 33, form the data in the word. Having received this word serially, the conversion means 10 convert it to parallel, then form two 32-bit words coded on the basis of the ARINC 429 standard, and then convert these two words to serial in order to send them to the transfer means 9 at the output of the conversion means 10. The two 32-bit words coded on the basis of the ARINC 429 standard are shown in FIGS. 3a and 3b.

The first byte of the word shown in FIG. 3b is labeled 30. The next two bits, Nos 9 and 10, can, in line with the ARINC 429 standard, form an identifier for the transmitter and for the receiver of the digital signal. By way of example, these two bits both take a logic level of 0. The two data bytes 31 and 32 occupy bits Nos 11 to 26 in the word shown in FIG. 3b. The next three bits, Nos 27 to 29, which are intended to receive data in the ARINC 429 standard, take logic levels of 0. Bits 30 and 31, which are intended to receive information about the status of the word, take logic levels of 1, for example. The last bit, No 32, is the result of a parity calculation performed on the first 31 bits of the word.

The first byte of the word shown in FIG. 3c is likewise labeled 30. The next two bits, Nos 9 and 10, take, by way of example, a logic level of 1 for bit No 9 and a logic level of 0 for bit No 10. In other words, these two bits form an extension of the label 30, and the logic levels they take in FIG. 3c make it possible to distinguish this word from that shown in FIG. 3b, where bits Nos 9 and 10 both take logic values of 0. Byte 33 occupies bits Nos 11 to 18 in the word shown in FIG. 3c. Bits 30 and 31 take logic levels of 1, and the last bit No 32 is the result of a parity calculation performed on the first 31 bits of the word shown in FIG. 3c.

The transfer frequency for the signals coded on the basis of the ARINC 429 standard can be 100 kbits per second, a frequency which is distinctly higher than that for the signals coded on the basis of the ARINC 568 standard. This difference in frequency makes it possible to transmit two words coded on the basis of the ARINC 429 standard in the time required to receive one word coded on the basis of the ARINC 568 standard.

Advantageously, the device can comprise means for automatically recognizing the standard received. By way of example, the control unit 11 can carry out this recognition by testing the logic level which is at the output 25. If this signal is permanently at logic level 0, the signal received has been coded on the basis of the ARINC 568 standard. In the opposite case, the signal has been coded on the basis of the ARINC 429 standard.

What is claimed is:

1. A device for receiving digital signals on the basis of two different standards conveyed on the same medium comprising:

logic-level conversion means receiving the digital signals and converting their logic levels into logic levels on the basis of a single standard, reception means for receiving signals coded on the basis of a first standard, which signals are output by the logic-level conversion means, means for converting signals coded on the basis of a second standard into signals coded on the basis of the first standard, which signals are output by the logic-level conversion means, means for transferring signals output by the means for converting signals coded on the basis of the second standard into signals coded on the basis of the first standard to the reception means upon reception of signals coded on the basis of the second standard, or for transferring signals output by the logic-level conversion means upon reception of signals coded on the basis of the first standard.

2. The device as claimed in claim 1, wherein the first standard is the ARINC 429 standard and the second standard is the ARINC 568 standard.

3. The device as claimed in claim 2, wherein the means for converting signals coded on the basis of the ARINC 568 standard into signals coded on the basis of the ARINC 429 standard convert a 32-bit word coded on the basis of the ARINC 568 standard into two 32-bit words coded on the basis of the ARINC 429 standard.

4. The device as claimed in claim 2, wherein the single standard is the T.T.L. standard.

5. The device as claimed in claim 4, further comprising means for testing operation of the device.

6. The device as claimed in claim 5, further comprising analog multiplexing means receiving either the digital signals or output signals which are output by transmission means on the basis of the first standard, depending on a test command, the analog multiplexing means transmitting the signals they receive by the logic-level conversion, means comprising means for comparing the signal transmitted by the transmission means with the signal received by the reception means.

7. The device as claimed in claim 6, wherein the signals are received in the form of a variable voltage, in that the logic-level conversion means comprise means for comparing the variable voltage with a threshold voltage ($U_{thresh}$) and means for comparing the variable voltage with a second threshold voltage ($-U_{thresh}$), and in that the result of each comparison takes one of the logic levels from the single standard.

8. The device as claimed in claim 7, wherein the value of the threshold voltage ($U_{thresh}$) is more or less equal to the opposite of the value of the second threshold voltage ($-U_{thresh}$).

9. The device as claimed in claim 8, wherein the value of the threshold voltage is between 3 and 6.5 volts.

10. The device as claimed in claim 9, wherein the means for converting signals coded on the basis of the ARINC 568 standard into signals coded on the basis of the ARINC 429 standard convert a 32-bit word coded on the basis of the ARINC 568 standard into two 32-bit words coded on the basis of the ARINC 429 standard.

11. The device as claimed in claim 1, wherein the single standard is the T.T.L. standard.

12. The device as claimed in claim 1, further comprising means for testing operation of the device.

13. The device as claimed in claim 1, further comprising analog multiplexing means receiving either the digital signals or output signals which are output by transmission means on the basis of the first standard, depending on a test command, the analog multiplexing means transmitting the signals they receive by the logic-level conversion means comprising means for comparing the signal transmitted by the transmission means with the signal received by the reception means.

14. The device as claimed in claim 13, further comprising analog multiplexing means receiving either the digital signals or output signals which are output by transmission means on the basis of the first standard, depending on a test command, the analog multiplexing means transmitting the signals they receive by the logic-level conversion means comprising means for comparing the signal transmitted by the transmission means with the signal received by the reception means.

15. The device as claimed in claim 1, wherein the signals are received in the form of a variable voltage, in that the logic-level conversion means comprise means for comparing the variable voltage with a threshold voltage ($U_{thresh}$) and means for comparing the variable voltage with a second threshold voltage ($U_{thresh}$), and the result of each comparison takes one of the logic levels from the single standard.

16. The device as claimed in claim 15, wherein the value of the threshold voltage ($U_{thresh}$) is more or less equal to the opposite of the value of the second threshold voltage ($-U_{thresh}$).

17. The device as claimed in claim 16, wherein the value of the threshold voltage is between 3 and 6.5 volts.

18. The device as claimed in claim 15, wherein the means for converting signals coded on the basis of the ARINC 568 standard into signals coded on the basis of the ARINC 429 standard convert a 32-bit word coded on the basis of the ARINC 568 standard into two 32-bit words coded on the basis of the ARINC 429 standard.

19. The device as claimed in claim 18, wherein the value of the threshold voltage ($U_{thresh}$) is more or less equal to the opposite of the value of the second threshold voltage ($-U_{thresh}$).

20. The device as claimed in claim 1, further comprising means for automatically recognizing the standard on the basis of which the digital signals have been coded.

* * * * *